United States Patent [19]

Freeman

[11] Patent Number: 4,862,399

[45] Date of Patent: Aug. 29, 1989

[54] METHOD FOR GENERATING EFFICIENT TESTSETS FOR A CLASS OF DIGITAL CIRCUITS

[75] Inventor: Smith Freeman, Skillman, N.J.

[73] Assignee: General Electric Company, Schenectady, N.Y.

[21] Appl. No.: 91,567

[22] Filed: Aug. 31, 1987

[51] Int. Cl.$^4$ .......................................... G01R 31/28
[52] U.S. Cl. .............................. 364/580; 324/73 AT; 371/24; 371/27; 371/23
[58] Field of Search ............... 364/489, 490, 491, 579, 364/580, 73 R, 73 AT; 371/23, 24, 27

[56] References Cited

U.S. PATENT DOCUMENTS

| | | | |
|---|---|---|---|
| 4,656,592 | 8/1987 | Spaanenburg et al. | 364/490 |
| 4,692,920 | 9/1987 | Tannhaeuser et al. | 371/27 |
| 4,692,921 | 9/1987 | Dahbura et al. | 371/27 |
| 4,696,006 | 9/1987 | Kawai | 371/27 |
| 4,701,922 | 10/1987 | Kuboki et al. | 324/73 R |
| 4,725,975 | 2/1988 | Sasaki | 364/491 |
| 4,745,355 | 5/1988 | Eilhelberger et al. | 324/73 R |

OTHER PUBLICATIONS

Edward J. McCluskey, "Design for Autonomous Test," *IEEE Transactions on Computers*, vol. C-30, No. 11, Nov., 1981, pp. 866–874.

Magdy S. Abadir et al., "A Knowledge-Based System for Designing Testable VLSI Chips," *IEEE Design & Test*, Aug. 1985, pp. 56–58.

Magdy S. Abadir et al., "Test Schedules for VLSI Circuits Having Built-In Test Hardware," *IEEE Transactions On Computers*, vol. C-35, No. 4, Apr. 1986, pp. 361–367.

Smith Freeman, "The F-Path Method of Test Generation for Datapath Logic," Proceedings of Custom Integrated Circuit Conference, Portland, Oregon, May 4–7, 1987.

*Primary Examiner*—Parshotam S. Lall
*Assistant Examiner*—Tuan A. Duong
*Attorney, Agent, or Firm*—William Squire; James C. Davis, Jr.; Paul R. Webb, II

[57] ABSTRACT

A digital logic circuit is broken into functional blocks, each having a path from its output port to a chip level output port. No two input patterns to that path produce the same output pattern on that path and for every path input pattern there is a one-to-one relation with the path output pattern regardless of the transformation of that pattern by the path. All other path inputs are independent of the path test patterns such that a block test output pattern applied to that path is not fault affected by those other path inputs. The circuit is partitioned into testable blocks whose outputs are coupled by such paths to observable chip output ports. The chip level tests for all block test patterns are screened to eliminate redundant block tests to produce a practical set of test vectors.

15 Claims, 4 Drawing Sheets

METHOD FOR GENERATING EFFICIENT TESTSETS FOR A CLASS OF DIGITAL CIRCUITS

This invention relates to a method for generating testsets for digital circuits.

A digital circuit to be manufactured as an integrated circuit chip is tested to insure that it has been correctly designed and manufactured. The test consists of a sequence of patterns called a testset. Each pattern consists of a collection of logical values to be simultaneously applied to the circuit inputs, together with the outputs expected of a correct, fault-free circuit.

The degree of completeness or thoroughness of a testset is expressed as its "coverage," typically expressed as a percentage of a conventionally defined group of "faults" — defects in the circuits that cause incorrect logical values to occur.

The available methods for constructing or generating such a testset typically require substantial investments of engineering effort and computer run-time. Circuit modification may also be required, sometimes referred to as Design for Test (DFT). The testset permits the design to be verified by software simulation, minimizing the danger of subsequent costly modification of the masks, and permits chips of high quality and reliability to be manufactured.

One method of developing testsets employs partitioning: the circuit (chip) is divided into smaller blocks for which testsets can be more easily generated. For each such block, a method is devised for constructing a pattern to be applied to the chip-pins that causes each pattern in the block-testset to be applied to the block-pins. Typically this involves added circuitry on the chip to simplify the manner in which patterns at the block boundary are related to patterns at the chip boundary. The chip testset ultimately consists of the concatenations of all the chip-pin testsets for each of the blocks in each signal path through the chip.

In developing such testsets, the problem addressed is to provide a technique in which test patterns applied to chip input pins (which normally are the only available means to apply test signals to the internal circuitry) cause the required patterns to be applied to partitioned smaller blocks. A further problem is, once having applied such test patterns, referred to in this art as test vectors, to the smaller blocks, how to reliably insure that the output patterns at the chip output pins actually represent the condition or state of the so partitioned tested block. Specifically, the problem is how to be certain that fault-caused changes at the block outputs will cause detectible effects at the chip pins. Due to the relative complexity of such circuits, which sometimes include thousands of interconnected components, the test methodology must insure on a sound basis not only that the desired test vectors reach the block under test, but also that its output signals are accurately observed.

A still further problem is verifying the efficacy of a testset by circuit simulation. Such simulation is used to model the effects of a conventional set of logical faults since it is not feasible to introduce actual faults onto a test chip.

Much attention has been given in the literature to the problem of ascertaining the appropriate signal propagation paths from chip input ports to internal blocks under test and the appropriate paths from those blocks to the chip output ports. For example, M. S. Abadir and M. A. Breuer in "A Knowledge-Based System for Designing Testable VLSI Chips," *IEEE Design and Test*, August 1985, pp. 56–68 and in "Test Schedules for VLSI Circuits having Built in Test Hardware," *IEEE Transactions on Computers*, April 1985, pp. 361–367 attempt to present a logical scheme for identifying circuit paths for the purpose of propagating signals to and from test blocks. One such scheme is referred to by them as the I-path (I for "identity"). E. J. McCluskey and S. Bozorgui-Nesbat in "Design for Autonomous Test," *IEEE Transactions on Computers*, Nov. 1981, pp. 866–875, discuss similar ideas.

The I-path concept relates to identifying circuit paths wherein test vectors are propagated identically without change through certain circuit components except possibly for a time lag. The I-path concept thus insures that test patterns are propagated through such paths so that appropriate test vectors are applied and observed at designated circuit points. However, they do not give a sufficient set of conditions for recognizing an I-path that is independent of the unique circuit representation used in their description. Further, I-paths are not generally practical because transformation of signals frequently occurs in most circuits.

Abadir et al. have also considered extending the I-path concept to a "T-path" (transformation) over which data can be transformed in some fashion, rather than being identically reproduced. However, their T-path is not fully explained. They say that there is a "one-to-one relation between inputs and outputs". But this is ambiguous terminology. Apparently they mean that each possible output pattern is produced by exactly one input pattern or vice versa. If so, it is also too restrictive a concept and will be inapplicable in many instances.

McCluskey et al. advocate exhaustive testing. However, they require special circuits to observe the anticipated ouputs. They assume that the desired outputs are observable without providing the mechanisms to observe such outputs. Abadir et al. in suggesting T-paths have not dealt with the problem of how to attain reliable test results at a circuit output port at the chip level which reflects a true observation of the test data produced by an internal circuit under test.

According to the present invention, a method for generating a compact set of test vectors for a digital circuit having a set of output signal patterns in response to an applied set of input signal patterns comprises dividing the circuit into a plurality of separate, different functional blocks. For each such block a path is determined which reliably reproduces at at least one observable output port of the digital circuit any fault effect produced by any test input pattern applied to each block.

Figure 1:
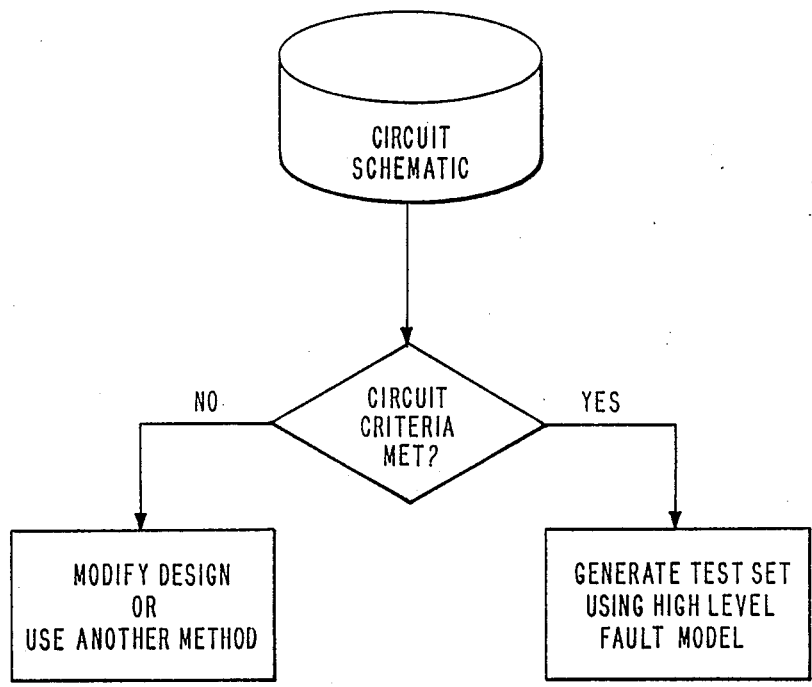
FIG. 1 is a flowchart diagram illustrating methodology according to one embodiment of the present invention.

In FIG. 1, it is assumed that a circuit schematic has been created for a given application. Criteria which are part of this invention are employed to determine the applicability of test generation methods which are also part of this invention.

In order for the design to be fault simulated and the circuit committed to manufacture, a circuit test scheme needs to be created for testing the circuit at the chip level. Because of the numerous test vectors required to test such a circuit chip exhaustively, or even pseudo-exhaustively, for most possible faults, the time required to test each circuit in a manufacturing environment becomes impractical or, even, unfeasible. Even more basic is the need for a test scheme that reliably observes fault data at the chip level output ports for test vectors applied to internal blocks.

In FIG. 1, the methodology approaches the solution to the problem of test vector generation for a complex circuit in two levels. In the first level, it is recognized that not all integrated circuits are classifiable into a given testable category. For example, the circuits may be divided into digital and non-digital classes, the digital class being testable according to the below described methodology. Further, the digital circuits may be further classified into combinational logic and sequential logic.

One aspect of the first level is directed to providing an efficient testset of vectors for complex digital circuits which include combinational and sequential logic. Therefore, the schematic is initially evaluated to determine if the circuit comprises combinational and sequential logic before proceeding. If the circuit is not classifiable or not modifiable to be so comprised, then the present methodology may not be applicable.

A second aspect of the first level of the test vector generation methodology is to reliably observe the test data at the chip level, i.e., at the chip output ports. This is a non-trivial problem, as discussed in the literature, (e.g., Abadir et al. and others cited in the background of invention). A solution to this problem resides in determining whether the circuit can be partitioned in the manner to be described below. The partitioning of a circuit includes several steps.

In the first step, the circuit is partitioned into blocks each consisting of a register or of combinational circuitry. If possible, the blocks are to be small enough so that each individually could be exhaustively tested; otherwise it is desirable that they be functional units and as large as possible. Large-scale feedback, if any, is to be broken for test purposes. Each individual block testset comprises the set of all possible distinct inputs to the block in question. The partitioning step requires that each partitioned block have an identifiable set of input terminals and output terminals. The input patterns to the input terminals can then be simulated and the corresponding output patterns at the output terminals determined. The use of partitioning and block testsets have been used by others for various purposes. The purpose of partitioning a circuit into blocks is to provide subcircuits which can be exhaustively or pseudoexhaustively tested in a practical manner. Also, the partitioning serves an additional purpose related to the creation of a testset using a high-level fault model to be discussed below in more detail.

However, once a circuit is partitioned, and this will be discussed in more detail below in connection with a specific logic circuit (e.g., a multiplier illustrated in FIG. 5), the problem of fault simulating and later testing the so created blocks includes the non-trivial aspect of reliably identifying at the chip level outputs the observation of the patterns occurring at each block level output port. This latter problem is treated in the present invention by a concept in which the coupling of the output ports of each partitional block is traced to the chip level output ports by a novel methodology.

This methodology identifies certain paths between the block output ports and the chip level output ports as reliable and with a high degree of certainty permits the observation at these chip level output ports the resulting block level test outputs. Such paths are referred hereinafter as F-paths, where F represents fault. The block level output patterns on certain chip level output ports are observed and identified a priori on the basis of the previously laid out F-paths.

As will be explained more fully later on in the specification, F-paths differ from Abidir et al. T-paths and I-paths in that a methodology is present which is logically correct and which is easily verifiable with empirical and observable circuit characteristics inherent in combinational and sequential logic. Thus, the most important feature of a circuit after it has been determined to meet the initial criteria above is whether the partitioned blocks can be coupled to the chip level output ports by F-paths. If this criteria is met, then the methodology proceeds to the creation of a testset using a high-level fault model which will be discussed in connection with FIG. 2. In some cases, some circuit modification may be required in order to make into F-paths certain paths between partitioned blocks and the chip output ports.

The second level of test vector generation includes the creation of testset using high-level fault models. After reliably determining that certain partitioned blocks can have their outputs observed at the chip level output ports, the problem remains, however, how to deal with the resulting testset which may include too many test vectors for practical testing vectors. The solution to this problem resides in the methodology of FIG. 2 which will be discussed in more detail later.

In determining whether the circuit meets the criteria of the present methodology, assuming the circuit comprises combinational and sequential logic, the partitioning step inherently requires the determination of the F-paths from each partitioned block to the chip output ports. If F-paths cannot be identified, then such paths may be created by either modification of the current chip circuitry or by special circuitry added for this purpose.

F-paths are paths which provide reliable observable test data at chip pin output ports. It is recognized that a number of digital circuits comprise relatively complex sub-circuits, e.g., hundreds of gates, but yet have certain properties which, when recognized and utilized as described herein, enable circuits to be partitioned and tested exhaustively using F-path concepts.

For example, adders have a number of properties that can greatly simplify the task of devising tests for circuits in which they appear. By taking full advantage of these properties, it is possible to test a substantial circuit (8k gates) to very high standards of coverage without adding any extra DFT hardware. While adders are key building-blocks, these techniques can be used with other kinds of processing blocks such as registers, multiplexers (muxes) and buses in datapath applications.

An F-path exists as a path through one or more functional blocks, if for every given block input pattern at a given input port there is a corresponding distinct output pattern, on a given output port from that block or block sequence on a one-to-one basis. As distinguished from the I-path concept which requires identity of patterns between the input and output ports and from the T-path concept which requires all possible output patterns to be produced by some applied input patterns, an F-path exists in functional blocks for every given input pattern applied on an input port thereof only if there occurs in response to that input pattern one and only one corresponding output pattern on an output port thereof. While there is a one-to-one relation of input pattern to output pattern, the patterns are not necessarily the same and often, in most cases, do differ. The significance is, however, that each output pattern is produced by one, and only one, input pattern to that functional block. So it is clear that while some I-paths and some T-paths may be F-paths, not all F-paths are T-paths or I-paths.

It should be emphasized that an F-path is easily verified since for a given functional block, that block, with mathematical certainty, can, by observation and analysis of its functional characteristics, easily be identified as belonging to the F-path category. The block may be large or small in terms of components as long as it meets these requirements. The condition for a data path through a block to be an F-path is that no two different input patterns produce the same output pattern. If a fault perturbs the input, it necessarily perturbs the output as well.

Figure 3:
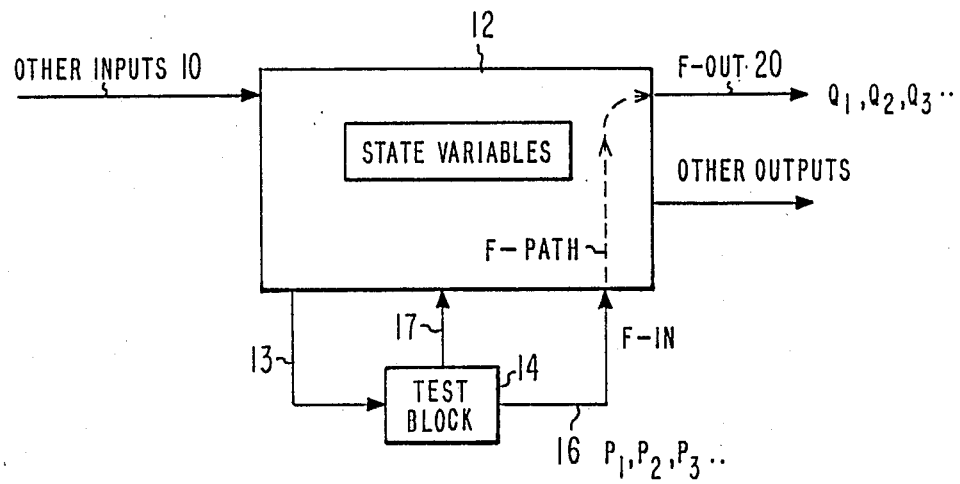
FIG. 3 is a diagram useful for illustrating the principles of the present invention.

In FIG. 3, the other input patterns 10 to the F-path functional block 12 of a given circuit are constrained in a way that is not dependent on the particular sequence of input patterns derived from test block 14 thus, patterns applied to block 14 via line 13 from block 12 are also constrained so as to be not depending on the patterns at least 16 to block 12 at lead 16. That is, the other input patterns 10 may need to be constrained so that block 12 becomes an F-path which is independent of the test sequence which will be applied to test block 14. This condition can easily be identified in any complex circuit and examples of such functional blocks and the required constraints will be given below. Test block 14 is under test and has an output on lead 16 applied as an input to block 12. The test block 14 may have faults. Assume an F-path exists between the F-in input of block 12 from lead 16 and the F-out lead 20 of block 12, the F-in input being the output of test block 14. In the general case, if block 14 has sequential data $P_1, P_2, P_3 \ldots$ on its output lead 16 and the F-out lead 20 of block 12 has sequential data $Q_1, Q_2, Q_3 \ldots$ then there is a one-to-one correspondence of the data ($P_i$ and $Q_i$) on block 14 output lead 16 to the data on lead 20. Thus, if any test block sequences on output lead 16 change, then the lead 20 output observed sequences change on a one-to-one basis. This is the essence of the F-path property. Therefore, any arbitrary test sequence can be employed to detect fault changes. Also the initial state of the logic of block 12 forms an input analogous to an "other input" and may be constrained, as a necessary condition of the existence of an F-path, but only in a fashion independent of the sequence of patterns at F-in. This can be only ascertained by observation of a given circuit.

The utility of an F-path is that it provides a path along which a fault from a test block can be observed at a chip output port. As long as there is a one-to-one relationship between an F-path input pattern to its output pattern, a cascaded series of such F-paths permit an output pattern to be known a priori at a chip output port for every block input test pattern applied along the F-path from that block. In other words, the outputs of a partitioned sub-circuit block in a large circuit can be identified as a series of F-path units. A test signal input pattern applied to that sub-circuit block in a "good" block necessarily causes the block to generate a known output. That output signal pattern is propagated through the circuit to the chip output ports along the identifiable F-paths. Necessarily, the observable chip output ports are the output terminals of an F-path block. Even if that observed output signal pattern is different than the functional sub-circuit block output pattern, the observed pattern can be easily ascertained.

A path weaker than an F-path, e.g., one-to-one only in special cases, can be defined where something is known about the nature of the faulty sequence. For example, in FIG. 3, suppose the faulty sequence is at least reproducible, block 12 can be initialized and driven by the suspect test output sequence one or more times. The specific manner of initialization and control by inputs exclusive of lead 16 and lead 17 can differ from one pass to another. The weakened path condition is then that the mapping includes the entire set of block 12 outputs of all passes.

An important application of this principle is to the case where no F-path exists for the whole set of outputs of block 14. Then the generalization permits the combination of two passes: in one an F-path for lead 16 exists, in the other one for lead 17. Together they constitute a generalized F-path for the union of lead 16 and lead 17, and thus guarantee the detection of any fault manifested at the outputs of block 14.

The forward paths from lead 16 at which a fault effect is introduced do not reconverge except at MUXes, where reconvergence is harmless because of the switch action which feeds only one input at a time to the output. Reconvergence of data from the normal primary inputs of block 12 is acceptable and harmless. The fault effect is regarded as an independent signal source; and what is of concern is reconvergence of data from this source alone.

Assuming registers act only to pipeline data, so the entire effect of the circuit of block 12 is equivalent to a large combinational block plus a fixed lag, this suffices to identify F-paths. In circuits such as Finite Impulse Response (FIR)-filters, which may include adders, however, patterns entered on successive clock-cycles may be combined. If the circuitry can be ,initialized in a way that does not depend on possibly faulty data from lead 16, the lagged patterns can generally be treated as fixed, known data, and the F-path is determined as above.

Consider a first pattern for which the effect of the fault at lead 16 is non-zero. In the collection of paths from lead 16 to lead 20 which are capable of conveying fault information, there is one with minimum delay. Assume this is a cascade of blocks with F-paths. This cascaded path may pass through several adders where faulty information can appear on both inputs, but at each, the lags involved are different (by assumption), then the path identified is associated with the shorter delay. Thus when the first faulty pattern reaches each such adder, the data on the other input is predetermined and fault-free, so the F-path exists for at least that one cycle. But then the entire path is an F-path, since each block in the path either has an F-path for the reason cited or else has an I-path by hypothesis. Thus the output pattern on lead 20 that first is affected by the faulty pattern on lead 16 is necessarily changed by the non-zero fault effect.

An adder has an F-path from either of its inputs to its output if the other input has data thereon independent of a fault effect, i.e., that data does not derive from a faulty module. That is, an adder has an F-path from either input to its sum-output whenever the data on the other input is fixed, i.e., is not "contaminated" by any possible effect of the faulty block under test. Datapaths are largely made up of adders and various kinds of multipliers and filters based on them.

Registers, MUXes, shifters and limiters, either have F-paths or can be given them at relatively modest cost in added logic circuitry.

The architectural condition of a complex circuit that must be met to assure the existence of a desired F-path is that it must be possible to cascade blocks (wired output to input) in the circuit so that each is traversed by an F-path. The identification of a "block" forming an F-path is a matter of convenience; sometimes blocks may be regrouped as part of the test generation strategy. Assume that all blocks with multiple input data-ports are one of two types. Either they are like MUXes, e.g., a switch, for which the output depends on only one input, the selection of which is under control, or else they are like adders, for which an F-path exists automatically from either input, provided that the other data input is independent.

Suppose in FIG. 3 the fault information is propagated from lead 16, forward to all affected circuitry in block 12. At each MUX in such a circuit assume the condition is met for propagation of the fault effects. Lead 20 is thus reached by the propagated fault effects. Consider all possible settings of those MUXes that are present in the forward cone of the possible fault effects. An F-path will be present for any such setting that causes the independent condition to be met for all adders on the path, provided that the resulting cascaded F-path reaches all the way to the output port at lead 20. Thus, a cascade of individual blocks, each of which has an F-path, also has an F-path. Such blocks may have other inputs, but constraints must be made on the other inputs.

It should be understood, however, the definition of an F-path is useful for determining and identifying the presence of an F-path. Once an F-path is identified, then in utilization of such an F-path during a test mode, the other input to the F-path, while it may be of arbitrary value, has a known predetermined value when the test vectors are applied through the F-path. For example, an adder adds its two inputs. Therefore, it is axiomatic that in order to sum these inputs, each input must have a known value. The output of the adder therefor must also mathematically have a known value. It is, therefore, important to distinguish between the information needed to recognize and determine an F-path in a given circuit and the subsequent utilization of such an F-path during test.

By definition of an F-path given above, it should be clear that determination of the existence of an F-path is based upon block functionality, i.e., how a block behaves. The mathematical definition of an adder makes it clear that the output of an adder (and subtractor) meet the definition of an F-path, i.e., the output has a one-to-one relation with one of the inputs, and a determinable value, for any value on the other input, for a given value of an input pattern on the one input.

Every I-path in MUXES by definition is an F-path, where for each output there is a specific one-to-one relation with an input. The condition is that a control line is set so that data on the other input is irrelevant.

A multiplier has an F-path from either input to its full-width output so long as the other input is independent of fault effects, i.e., not derived from a faulty circuit and has a coefficient of one.

An idealized filter has an F-path input F-IN and an F-path output F-OUT, a Subtractor being between F-IN and F-OUT. F-IN is fed to a register which has a reset input R that by definition is independent of faulty data.

An idealized accumulator includes an adder having one input F-IN and an output coupled as an input to a register. The output of the register is F-OUT which is also the second input to the adder. Similar to the filter, if the reset input of the register is independent of faulty data, then there is a one-to-one relation between the data on F-OUT with the data on F-IN.

If registers are initializable without using possibly faulty data and if the minimum delay path is an F-path for a single pattern in the combinational, then there is an F-path in a general sense.

If reconvergent fan-out occurs at a low level inside a block-level primitive, it is irrelevant to the F-path formed by that block if that block by definition has an F-path. If the fan-out occurs at a sufficiently high-level, e.g., muxes, it is harmless and can be disregarded. If the fan-out is at an intermediate level and can be broken out as a block, the block can be functionally analyzed and the existence of an F-path established from the definition of F-path.

If sequential logic has an initial state which is independent of fault effects, then a set of sequential data applied to an input of the sequential logic forms an F-path with a sequential output of the logic for the purpose of testing for faults a test block that supplies sequential data to the sequential logic.

A complication to the determination of an F-path is one in which non-F-path elements can be made F-path with a minimum of added DFT circuitry. For example, a multiplier has two inputs and an output. Assume the output most significant bits (MSB) are fed to downstream logic. Because the least significant bits LSB's are omitted there is no F-path to that downstream logic. However, by adding a multiple input signature register (MISR) to receive the LSB's, the downstream logic and the MISR together form an F-path with either input or output of the multiplier.

If circuitry having an input I is truncated, so that only partial data appears on an output path, additional circuits can be added to receive the remaining data which together provide a one-to-one correspondence of data with the input I.

The above description provides representative examples of how to recognize, determine, and in some cases transform functional circuit blocks into F-paths. Because functional circuit blocks can be observed by mathematical principles as F-paths, test verification of such F-paths need not be made, such verification being relatively difficult.

It should be understood, however, that the partitioning of the circuit into blocks for ascertaining F-paths is separate from partitioning the circuits into test blocks. While F-path blocks may serve as test blocks, if may occur that some of such functional blocks may be too large for exhaustive test purposes. In this case the F-path functional block may be broken up into smaller blocks for test purposes. The F-paths need to be identified for each such partitioned smaller block of the functional block to the chip output ports. In employing the F-path technique, circuits are analyzed to break the blocks up according to the F-paths along the block outputs to the chip output pins. Thus data observed on the designated chip pins can be predetermined a priori for each given set of input patterns of a given partitioned block.

If a designated input pattern is applied to a given block, and how this is done will be described shortly, the F-path concept insures that there is a one-to-one relation of patterns along the entire length of the designated F-path to the output chip ports. The one-to-one relation of input to output along the F-path assures that the fault effect being ascertained in the given block under test is not contamination by a second fault effect. As long as such contamination does not take place, and there is only one output pattern for a given input pattern, it is reasonable that only one good output pattern will result for any given input pattern. The inputs to the different structures comprising the F-path components can be controlled by designating applied input patterns so that the F-path output, if good, has the desired anticipated pattern.

Thus, the circuit criterion of FIG. 1 includes whether the circuit to be tested can be derived into F-path configurations for all blocks contained therein. It does not matter how complex a block under test is, as long as its outputs can be traced along F-paths to the chip output pins. If the circuit cannot be divided into suitable F-paths, then, if at all possible, the circuit design should be modified or another test method devised for observing the test data. However, combinational and sequential logic circuits lend themselves to such F-path analysis and division.

F-paths permit test coverage to be determined by high-level simulation, which is relatively fast, employing high-level fault modeling. One example of such testset generation using high-level fault modeling is fast test screening, FIG. 2.

Figure 2:
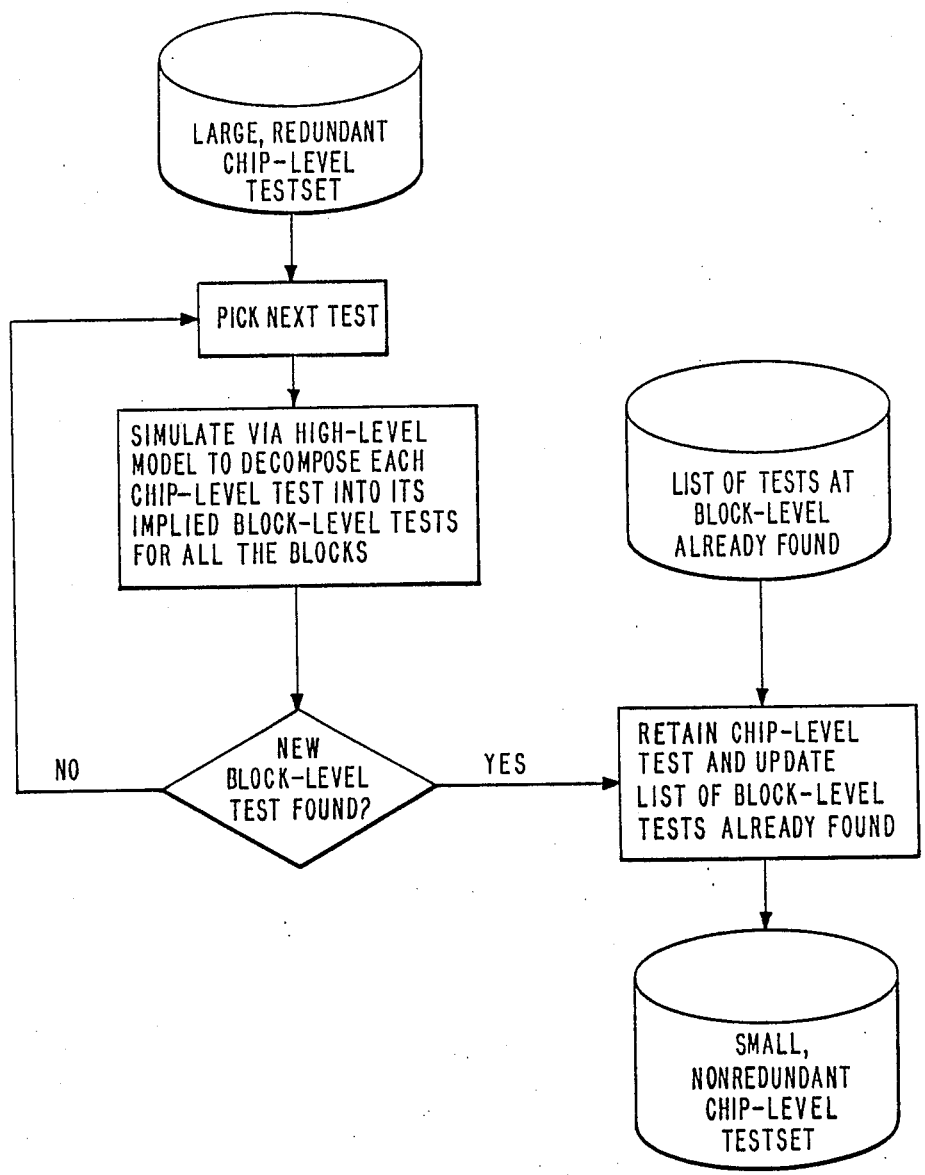
FIG. 2 is a flowchart diagram illustrating the high-level fault modeling utilized in the methodology of FIG. 1.

In FIG. 2, fast screen testset generation includes simulation of a high-level model and decomposing the model into the desired block level tests for all blocks. Simulation of test patterns applied at the block-level is well known and can be done with commercially available computer programs. The simulation technique produces the necessary test patterns to be applied to each partitioned block under test. Each such block has been previously defined as having outputs which are observable at the chip output pins via F-paths. The test patterns applied to each such block contain all of the test patterns necessary to exhaustively test that block. For each such applied test pattern, the simulation system can also provide the anticipated outputs of that block for each such applied input pattern. Once having ascertained such output patterns, the actual pattern of the chip output ports can be ascertained. If a fault in that block exists, then any pattern different than the anticipated pattern is a fault. Exhaustive testing of iterative systems e.g, bit slices, can be simulated. Any fault of a single block that does not change the number of its internal states is detected by partitioned exhaustive testing. The larger the block, the better the coverage. However, too large a block may result in an impractical situation in which there are too many test vectors.

Figure 4:
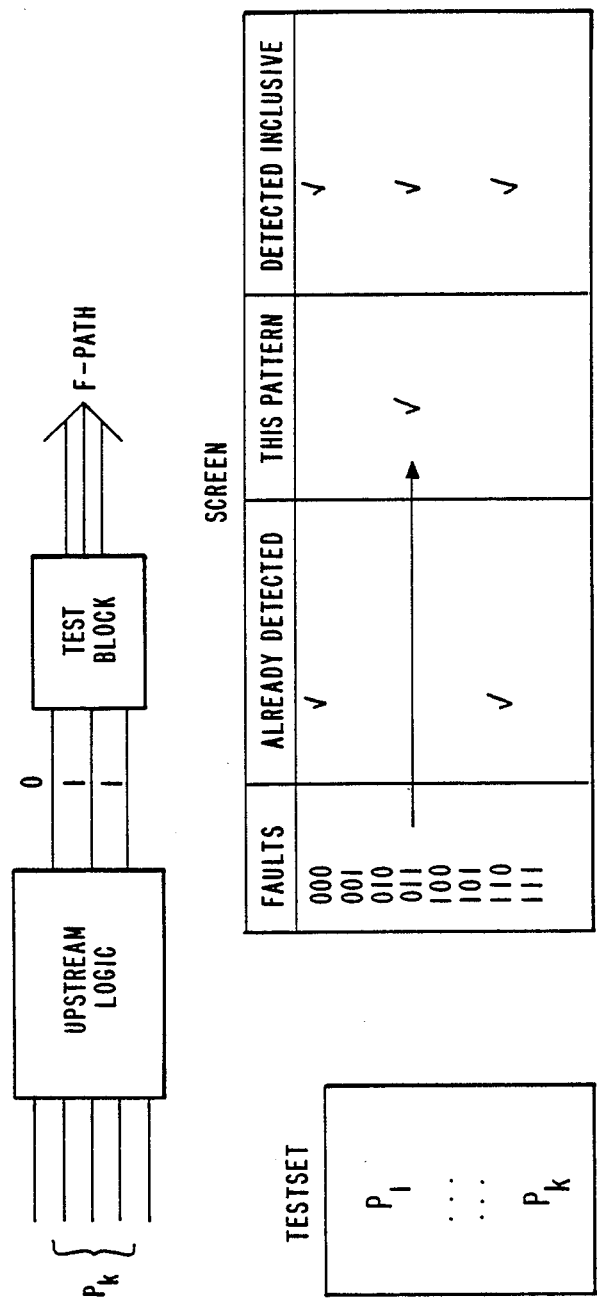
FIG. 4 is a diagram illustrating the method of FIG. 2.

In FIG. 4, a simulation methodology is shown to obtain a test pattern at a test block. $P_K$ represents a fault test pattern that is applied to upstream logic. The output of the upstream logic is evaluated to provide all possible input patterns to the test block. The block labeled TESTSET represents a list of all patterns $P_1$-$P_K$ applied to the upstream logic. In the block labeled "screen" the faults column lists all the patterns $P_K$ to be selected. A pattern is noted if it detects a new fault. Not all patterns may be of interest in testing the testblock, therefore, in the interest of efficiency only those patterns that may be useful in detecting a fault are kept. The remaining patterns of no interest are discarded.

In FIG. 2, once all the block level tests are determined for all blocks, these tests are retained in a list of tests. For every new block test found, that test is added to the list until tests for all blocks are completed. Such tests contain the test vectors to exhaustively test the entire circuit. To simulate testing with those test vectors by computer is relatively simple. However, to actually test a circuit on a chip with all such formed test vectors becomes an impractical task.

The resulting list of tests at the block level are screened at the chip level. Whenever two sets of chip-level test vectors yield the same tests at the block-level, one of the chip level tests is discarded. That is, whenever a chip level test is used more than once to produce the same block level tests, only one of those chip level tests is retained. What this means is that suppose a pattern $P_C$ at the chip level (applied to chip input pins) produces a pattern $P_B$ at a block level. Pattern $P_C$ is then compared to all other chip level tests patterns $P_C'$ for all blocks. If another chip level test pattern $P_C''$ is found which will produce a redundant pattern $P_B$ for the remaining block level tests of one or more partitioned blocks, then such additional pattern $P_C''$ is redundant and can be discarded from the chip level testset. This procedure is repeated for all block level tests until the test pattern $P_C$ contains only those patterns necessary to test all blocks. This results in an efficient testset which exhaustively tests the chip in practical way for use in a factory environment.

Figure 5:
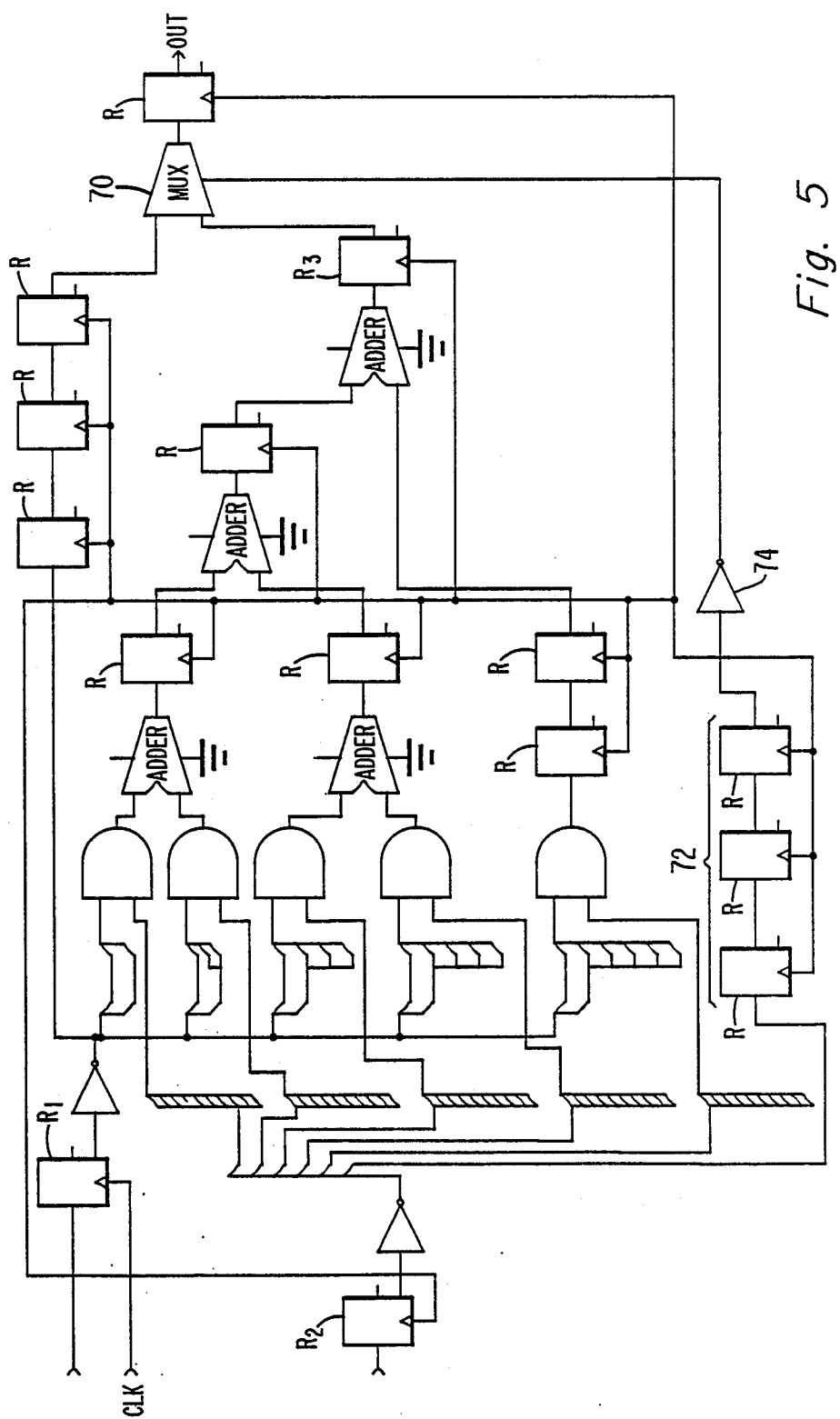
FIG. 5 is a circuit diagram of an integrated circuit digital multiplier employing registers, adders and a multiplexer (mux) useful for illustrating the principles of the present invention.

In FIG. 5, a special-purpose multiplier from an 8K-gate chip is shown for which a 100% coverage test-set was generated solely by means of F-path methods. $R_1$ is a storage register whose output is a ten-bit-wide first number e.g., multiplicand. $R_2$ is a storage register whose output is a six-bit-wide second number, e.g., a coefficient. These numbers are multiplied by a series of AND gates, adders, and registers R which provide two inputs to a mux 70. Mux 70 is controlled by a signal pipelined through register sequence 72 and inverter 74. The datapaths fan out from ten-and six-bit input ports. The paths reconverge at the inputs to downstream adders. These adders cannot be tested if either multiplier input is restricted to fewer bits. Note, however, that all the non-trivial blocks to be tested in this subcircuit are downstream of all fan-out stems. Thus a fault effect, which represents an independent signal source in one such block, does not reconverge. Rather it is mixed with fixed, independent data. F-paths can be easily seen to exist from all internal blocks to the primary output port.

The subcircuits or principal test cells of the multiplier of FIG. 5 comprising the adders and AND gates can each be separately tested as a partitional block. Each AND gate in the FIGURE represents an array of AND gates, e.g., 10 gates. The adders are each relatively more complex circuits. Each adder and AND gate of FIG. 5 can be analysed so that an F-path from its output can be traced to the multiplier output. A simulated test pattern is applied to that AND gate or adder and the output observed at the F-path output, in this case, the output of the multiplier. In this way each and every sub-block of the multiplier can be tested. A testset of vectors is constructed using the fast screen methodology for factory testing the multiplier in the manufactured chip.

To create the test vectors for the multiplier of FIG. 5, all $2^{16}$ possible inputs ($R_1$ and $R_2$ combined) are simulated at the RTL-level (register transfer level) at the inputs to registers $R_1$ and $R_2$. Patterns are retained if and only if they cause a new input pattern to be applied to at least one testcell i.e., a sub-circuit of the multiplier such as an adder or AND gate. The adders in this circuit comprise 4-bit carry-lookahead modules. These and the AND gates define the principal testcells.

The suggested procedure was carried out with the resulting computer program occupying about 160 lines of FORTRAN code, more than half accounted for by general purpose subroutines useable for any multiplier or other functional module based on adders. The program screened the full 16k+ test vectors in about 13 CPU seconds on an IBM 360. The final vector testset contained only 322 test vectors. The resulting coverage was, of course, as high as that provided by the full 16k+ test vectors, which amounts to exhaustive testing at the multiplier-block level.

The above procedure creates the test vectors for the multiplier of FIG. 5. If the multiplier is part of a larger circuit, then what needs to be done is merely apply a coefficient of one to register $R_2$. The multiplier block meets the F-path condition and serves as one segment of cascaded F-paths from a block under test (prior to the multiplier) to the chip level output ports through other circuits (not shown) which also form F-paths. Test vectors are created for each such F-path blocks or sub-circuits of such blocks or combinations of such blocks until test vectors are created for the entire circuit.

In further tests, a 10 bit wide CSD multiplier has been tested in this manner in which $2^{15}$ vectors were screened in 15 CPU seconds with 310 test vectors retained. An 8×8 array multiplier requiring $2^{17}$ vectors can be screened in 3 hours and 20 minutes on an Appollo workstation with 106 test vectors retained. A chip with 8k gates can be 100% tested with about 3K vectors. Utilizing the F-path principles, an RTL model and a computer main frame, about 1000 vectors per second can be screened, whereas on an Appollo workstation about 10 vectors per second can be screened. In contrast, adaption of a Mentor QSIM system results in about 1 vector being tested in 10 seconds and using conventional fault simulation on an Appollo workstation tests about 1 vector per 1000 seconds.

It should be understood that in testing a complex digital chip an assumption is made that independent inputs to blocks in the F-path are fault-free. However, subsequent tests of such blocks using F-paths actually determine whether or not such blocks are fault-free. Regardless, the F-path analysis of a circuit is based upon functional block descriptions which can be easily analyzed with respect to whether they meet or can be adapted to meet the F-path requirement of a one-to-one relation as discussed. Using such functional description and easily derived detailed operations of specific blocks based on some of the above theorems, an accurate RTL model can be derived and a practical testset formulated using computer simulation.

What is claimed is:

1. A method for generating a set of chip level test patterns for a digital circuit having a set of chip level output signal patterns in response to an applied set of chip level input signal patterns comprising:
   identifying a plurality of separate different functional circuit blocks in said circuit, each block having an input port and an output port;
   creating an exhaustive set of chip level test patterns which tend to cause block level test patterns to be applied to each said blocks;
   determining by circuit simulation which chip level test patterns cause each block level test pattern to be applied; and
   selecting those chip level test patterns that form said set of chip level output signal patterns wherein a block level test pattern is applied to each block at least once and discarding those chip level input test patterns which produce redundant block level test patterns.

2. The method of claim 1 wherein said creating step includes computer simulating said circuit to produce a large redundant chip level test pattern, and said determining step includes decomposing the chip level test pattern into block level test patterns for each said blocks.

3. The method of claim 1 wherein said identifying step comprises identifying a test path which includes at least one path block from the output port of each said identified functional circuit block to the applicable chip output ports receiving said chip level output pattern from that identified functional circuit block output port, and insuring each said path block has an input test pattern which is independent of all other input test patterns to that path block, so that different input test patterns to that path block do not produce the same output pattern for that block and there is a one-to-one relation of input test patterns to the output patterns of that block along the path.

4. The method of claim 1 wherein said determining step includes the steps of simulating by computer each chip level input test pattern that produces the desired block level input test pattern, storing each said chip level input test pattern, and said selecting step includes comparing said stored chip level test patterns and discarding those chip level test patterns which apply redundant block level patterns.

5. The method of claim 1 wherein said determining step includes simulating by computer simulation the input patterns to each said block, said method further including storing the output block patterns generated by each simulated input pattern and determining the output pattern of said digital circuit for that simulated input pattern wherein there is a one-to-one relation between each said block input pattern and said digital circuit output pattern and wherein no two different block input patterns generate the same digital circuit output pattern.

6. A method of determining a set of observable output ports at which an output test pattern is reliably reproduced from a set of test input patterns applied to a set of input ports of a digital circuit, said method comprising:
   dividing the circuit into a plurality of different functional blocks, said blocks tending to transform said test input pattern to a different pattern; and
   determining for each said functional block a test path, said test path characterized in that it can reliably reproduce at at least one of said observable output ports of said digital circuit a fault effect test input pattern applied to that block regardless the transformation of said input pattern to a different pattern at said circuit output ports.

7. The method of claim 6 wherein said determining step includes noting the simulated fault effect output pattern of each said block generated by a simulated input test pattern;

tracing said path of said simulated block output pattern to said observable corresponding at least one output port of said digital circuit; and determining the output pattern at said at least one digital circuit output port for each said simulated test input pattern.

8. The method of claim 6 wherein said determining step includes determining those paths which have a one-to-one relation of input pattern to output pattern.

9. The method of claim 7 further including the step of noting for each simulated input test pattern a simulated signal circuit level input pattern, screening said simulated digital circuit level input test patterns for redundacy by comparing said circuit input signal patterns for all said block test input patterns to one another and retaining only those digital circuit level input signal patterns which applies a different input test pattern to at least one block under test.

10. The method of claim 6 wherein said determining step includes determining a path from each said functional block to said at least one observable output port which is independent of any other input pattern at any other input port of that functional block wherein a fault propagated through said path is not reapplied to that block via any other block input port.

11. The method of claim 6 further including the steps of noting each digital circuit input pattern for each said block test input pattern, comparing each said block level input patterns to one another and discarding those digital circuit input patterns which apply the same block level input test pattern to at least one block, applying said compared digital circuit input patterns to an actual manufactured digital circuit, and comparing the output signals produced by said actual digital circuit to a known simulated set of output signals produced by a simulated digital circuit corresponding to the actual circuit.

12. The method of claim 6 wherein at least one of said blocks includes sequential logic, said method including the step of insuring that the initial state of said sequential logic of said one block is independent of the output of that block.

13. A method of creating a set of input test patterns for an integrated chip digital circuit having a set of output patterns in response to said set of input chip level test patterns applied thereto comprising:

dividing the circuit into a plurality of functional blocks from which blocks no two different output patterns of a given block output port in response to an applied block input pattern produce the same observable chip level output pattern at a chip level output port and there is only a one-to-one relation between each block output pattern and the chip level output pattern;

decomposing the circuit chip-level test patterns for all said blocks into a block level test for each said block;

retaining each said chip level test for each applied corresponding block level test; and comparing each chip level test so retained and discarding all chip level tests which apply duplicate block level tests so that only those chip level tests that apply different block level tests remain to produce a relatively small, nonredundant chip-level testset.

14. The method of claim 13 wherein said dividing step includes insuring that said applied block input patterns are each independent of all other input patterns to that block in the sense each output pattern of that block does not affect the content of the test input pattern for that block in an unknown undeterminable manner.

15. The method of claim 13 wherein said output patterns are observed at a chip level observation port, said method further including the step of identifying all blocks forming a path from said functional block output port to said chip-level observation output port having only a one-to-one relation and determining for each said block level test input pattern a test result pattern at said observation output port.

* * * * *